United States Patent
Goldman et al.

(10) Patent No.: US 10,268,542 B2
(45) Date of Patent: Apr. 23, 2019

(54) METHOD AND APPARATUS FOR TREATMENT OF STATE CONFIDENCE DATA RETRIEVED FROM A NON-VOLATILE MEMORY ARRAY

(71) Applicant: INTEL CORPORATION, Santa Clara, CA (US)

(72) Inventors: Matthew Goldman, Folsom, CA (US); Wayne D. Tran, Folsom, CA (US); Aliasgar S. Madraswala, Folsom, CA (US); Sungho Park, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 6 days.

(21) Appl. No.: 15/443,707

(22) Filed: Feb. 27, 2017

(65) Prior Publication Data

US 2017/0315866 A1   Nov. 2, 2017

Related U.S. Application Data

(63) Continuation of application No. 13/977,012, filed as application No. PCT/US2012/031225 on Mar. 29, 2012, now Pat. No. 9,582,357.

(51) Int. Cl.
| | | |
|---|---|---|
| *G06F 11/00* | (2006.01) | |
| *G06F 11/10* | (2006.01) | |
| *G11C 16/26* | (2006.01) | |
| *G11C 16/34* | (2006.01) | |
| *G11C 11/56* | (2006.01) | |
| *G11C 29/04* | (2006.01) | |

(52) U.S. Cl.
CPC ...... *G06F 11/1068* (2013.01); *G06F 11/1048* (2013.01); *G11C 16/26* (2013.01); *G11C 16/34* (2013.01); *G11C 11/5642* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 6,094,368 A | * | 7/2000 | Ching | ................. G06F 12/1408 365/185.03 |
| 8,213,228 B1 | * | 7/2012 | Yang | .................... G11C 11/5628 365/185.03 |
| 2008/0215930 A1 | * | 9/2008 | Radke | ...................... G11C 8/10 714/54 |
| 2009/0228761 A1 | * | 9/2009 | Perlmutter | .......... G06F 11/1008 714/763 |
| 2009/0244973 A1 | * | 10/2009 | Scheppler | ........... G06F 11/1068 365/185.09 |

(Continued)

*Primary Examiner* — Daniel F. McMahon

(57) ABSTRACT

An apparatus comprises a controller to retrieve data from a non-volatile memory, and an error correction module operable on the controller to read a memory cell of the non-volatile memory at a first set of sense conditions comprising a multiplicity of sense conditions. The error correction module may be further operable to set a first set of bits in an encoded output, the first set of bits comprising a logical state bit to indicate a logical state of the memory cell and one or more additional bits in the encoded output to indicate accuracy of the logical state bit based upon results of the read at the first set of sense conditions, the first set of sense conditions comprising a greater number than that of the first set of bits.

17 Claims, 12 Drawing Sheets

(56) References Cited

U.S. PATENT DOCUMENTS

| | | | |
|---|---|---|---|
| 2010/0125701 A1* | 5/2010 | Park | G06F 11/141 |
| | | | 711/103 |
| 2011/0131473 A1* | 6/2011 | Mokhlesi | G11C 11/5642 |
| | | | 714/773 |
| 2011/0197015 A1* | 8/2011 | Chae | G11C 11/5642 |
| | | | 711/103 |
| 2012/0026788 A1* | 2/2012 | Shalvi | G11C 16/26 |
| | | | 365/185.02 |
| 2013/0336057 A1* | 12/2013 | Chung | G11C 16/10 |
| | | | 365/185.03 |

* cited by examiner

METHOD AND APPARATUS FOR TREATMENT OF STATE CONFIDENCE DATA RETRIEVED FROM A NON-VOLATILE MEMORY ARRAY

CROSS-REFERENCE TO RELATED APPLICATIONS

This application is a continuation of, claims the benefit of, and claims priority to U.S. National Phase patent application Ser. No. 13/977,012, filed Jun. 27, 2013, which claims priority to international patent application No. PCT/US12/31225, filed Mar. 29, 2012. The subject matter of said U.S. national phase patent application and international patent application are incorporated herein by reference in their entireties.

BACKGROUND

As cell dimensions in memory devices scale to smaller dimensions, the integrity of data storage is challenged. In particular, the raw bit error rate in non-volatile memory devices such as NAND flash memory has been observed to increase with decreasing cell size. NAND flash architecture is structured such that memories are accessed much like block devices including hard disks or memory cards in which a block may contain multiple pages. NAND technology relies on an error correction code (ECC) process to compensate for bits that may spontaneously fail during normal device operation.

In order to achieve a tolerable bit error rate, an error correction engine is typically employed at the system level. The most common ECC that has been employed in recent generations of NAND products uses a so-called BCH code (the acronym is derived from the inventor's names Bose, Ray-Chaudhuri, and Hocquenghem). However, BCH code may not be able to deliver the error correction capability that may be required in future generation NAND products as the memory cell size continues to scale to smaller dimensions.

On the other hand, error codes such as the low density parity check (LDPC) provide greater capability, but require that a NAND memory provide data in a different manner than conventional user data. Unlike the BCH method, which uses "hard decoding," some codes including LDPC enable "soft decoding," where, in addition to each bit value, the decoder can also estimate the bit's reliability using other data. Soft decoding can yield significant correction capability gains over hard decoding, because the decoder knows which bits are more likely to be flipped and can use this information in its correction algorithms In particular, the LPDC procedure requires that state confidence data be provided. The state confidence data refers to data that reflects the reliability of data to indicate state of the memory cell. In error correction approaches that employ the LDPC scheme, an ECC engine may convert the state confidence information into conventional user data.

In order to achieve efficient generation of state confidence data for non-volatile memory devices, such as NAND storage devices, present day schemes may require modification. Accordingly, there may be a need for improved techniques and apparatus to solve these and other problems.

BRIEF DESCRIPTION OF THE DRAWINGS

FIG. 7 depicts another scenario that employs the arrangement of FIG. 6a.

DETAILED DESCRIPTION

Various embodiments involve novel systems, apparatus, and methods to read and correct data stored in a non-volatile memory. In particular, methods and apparatus of the present embodiments may treat stored data to determine the likelihood of data errors. Various embodiments are directed to generation of state confidence data and treatment of that data so that more accurate and efficient error correction may be applied.

In various embodiments, the data to be corrected may be stored in a non-volatile memory array, such as a NAND flash memory, phase change memory (PCM), a spin memory; stacked phase change memory (PCMS), magnetoresistive random access memory (MRAM), spin memory, nanowire memory, ferroelectric transistor random access memory (FeTRAM), or other memory from which it may be desirable to extract state confidence data regarding information stored in the memory.

In a non-volatile memory such as NAND flash memory technology, floating-gate transistors are used to store charge, which controls the threshold voltage ($V_T$) required to turn on a floating-gate transistor that controls a given memory cell. The $V_T$ level for a given memory cell, in turn, is used to determine the logic state of that memory cell. In the NAND flash architecture, a memory array is connected to word lines and bit lines in which several transistors are connected in series. Only if all word lines are pulled high (above the transistors' $V_T$) is the bit line pulled low. To perform a read operation, typically most of the word lines are pulled up above the $V_T$ of a programmed bit, while one is pulled up to just over the $V_T$ of an erased bit. The series group will conduct (and pull the bit line low) if the selected bit has not been programmed As the memory size of NAND flash increases, the separation between adjacent cells decreases and the likelihood of error generation increases, as noted previously. To address this issue, various embodiments provide improved methods of reading NAND devices so that the logical state of a memory cell can be more accurately and efficiently determined. In particular, as detailed below, the present embodiments provide novel procedures for encoding and managing state confidence information derived from multiple sense operations performed on a memory cell.

Figure 1:
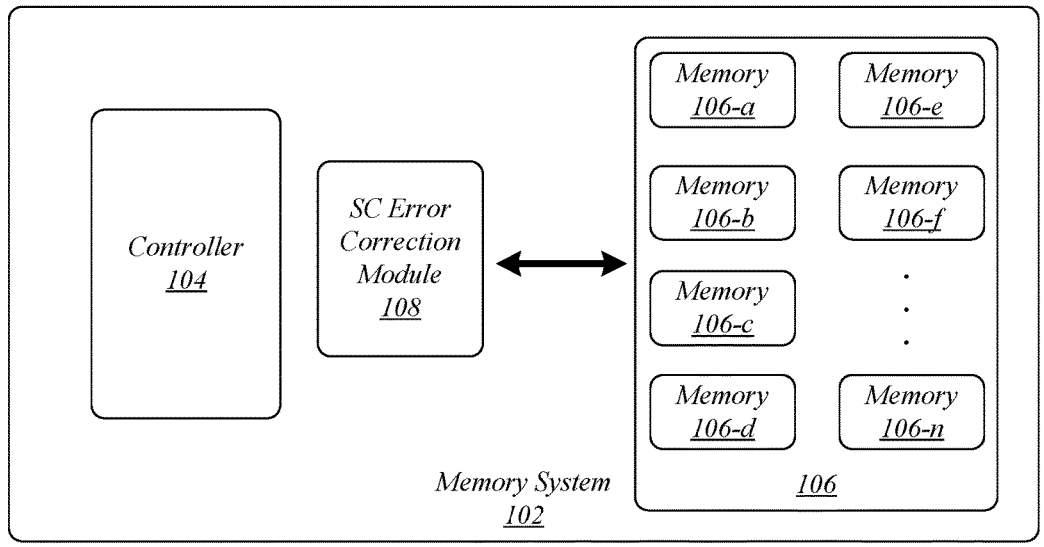
FIG. 1 depicts a block diagram of a system embodiment.

FIG. 1 depicts an embodiment of a memory system 102. The memory system 102 may include a controller 104, a state confidence (SC) error correction module 106, and memory 106, which may include multiple memory units 106-*a* to 106-*n*, where the integers, a, b, c, d, e, f, and n represents any positive integer. The memory system 102 may manage storage of information in the memory units 106-*a* to 106-*n*, including writing and reading data to memory. As detailed below, the SC error correction module 108 may determine and manage state confidence data for information stored in memory 106.

Figure 2:
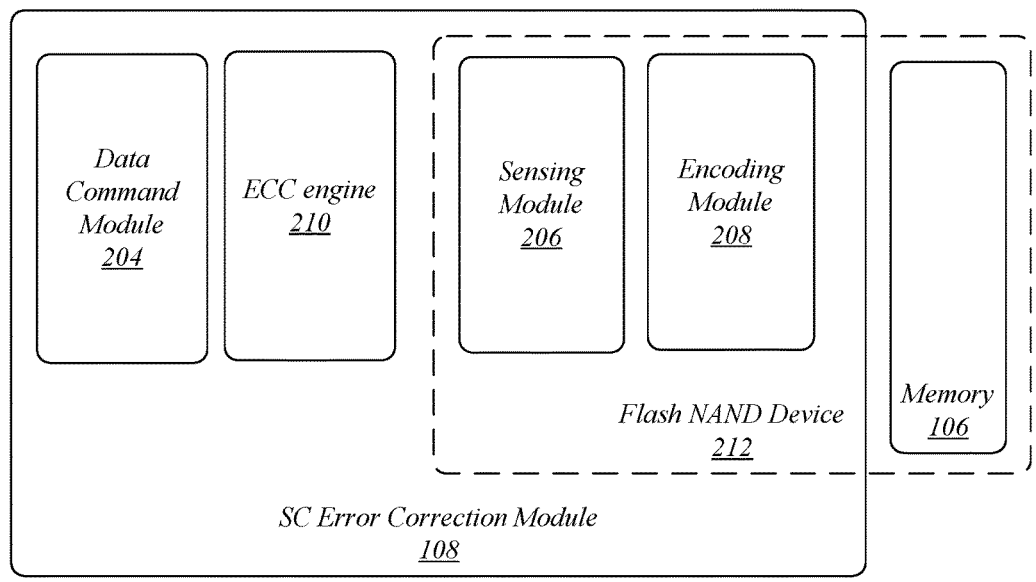
FIG. 2 depicts a block diagram of another system embodiment.

FIG. 2 depicts a block diagram of an embodiment of the SC error correction module 108. Unless otherwise specifically noted, the SC error correction module 108 and its constituent components may be embodied in software, hardware, or a combination of the two. In particular, not all components of the SC error correction module 108 need be located in a single device. Thus, some components may be located in a NAND chip while others are located external to the NAND chip. The SC error correction module 108 may include a data command module 204, whose operation is detailed below. In brief, the data command module may provide commands to the memory 106 that identify, for example, during a read operation, whether state confidence data is to be provided or whether data is to be read in a conventional manner The sensing module 206 may manage details of sensing operations to be applied to memory 106, including establishing sense conditions for reading data from memory cells in memory 106. The encoding module 208, whose operation is detailed below, may encode data that is read from memory 106, such as by encoding state confidence information for processing by an error correction technique. The error correction code (ECC) engine 210 may provide error correction to data extracted from memory 106, using a method that treats state confidence data, such as the LDPC method. In various embodiments, the data command module 204 and the ECC engine 210 may be located external to a NAND device 212, while the sensing module 206 and the encoding module 208 may be located inside a NAND device 212 together with memory 106, as illustrated.

Figure 3:
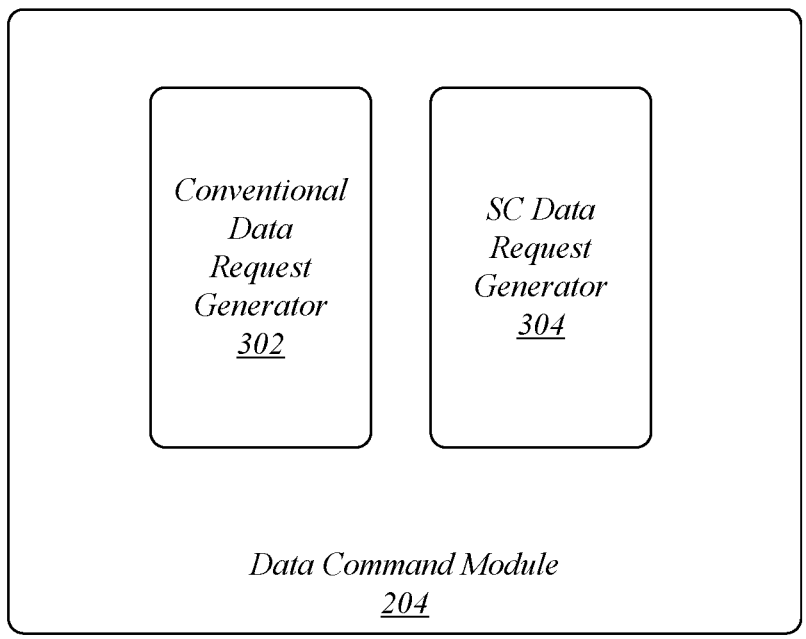
FIG. 3 depicts a block diagram of a further system embodiment.

FIG. 3 depicts details of a data command module 204. As illustrated, the data command module 204 may include a conventional data request generator, which operates to signal a memory that data is to be read out from the memory in a conventional format. The conventional format may provide the logical state of a memory cell being interrogated in the memory read as single-bit denoted by a "1" or a "0." Referring also to FIG. 1, for a given application or in response to a given device, the data command module 204 may determine, for example, that data from memory 106 need not include state confidence information. Therefore, the data command module 204 may employ the conventional data request generator to forward a signal to initiate a conventional read operation in the memory 106. The conventional read operation may entail the use of a conventional ECC procedure, such as the application of a BCH code. In other circumstances, the data command module 204 may determine, that a read operation is to include state confidence information. For example, in a dense memory, it may be appropriate to apply an LDPC ECC procedure for reading of a given set of data to improve reliability. As noted above, NAND memory typically relies on ECC as one means to compensate for bits that may be bad or may spontaneously fail during normal device operation. In conventional operation, if an ECC procedure cannot correct the error during read, it will pass that error through to the customer. However, the ability to correct errors using a BCH approach may be less than needed, especially for denser memories where failure rates may be high. If an LDPC error correction is to be applied to a data read operation, therefore, the data command module 204 may employ the SC data request generator 304 to forward a signal to initiate and manage a read operation that produces state confidence data for processing.

Figure 4:
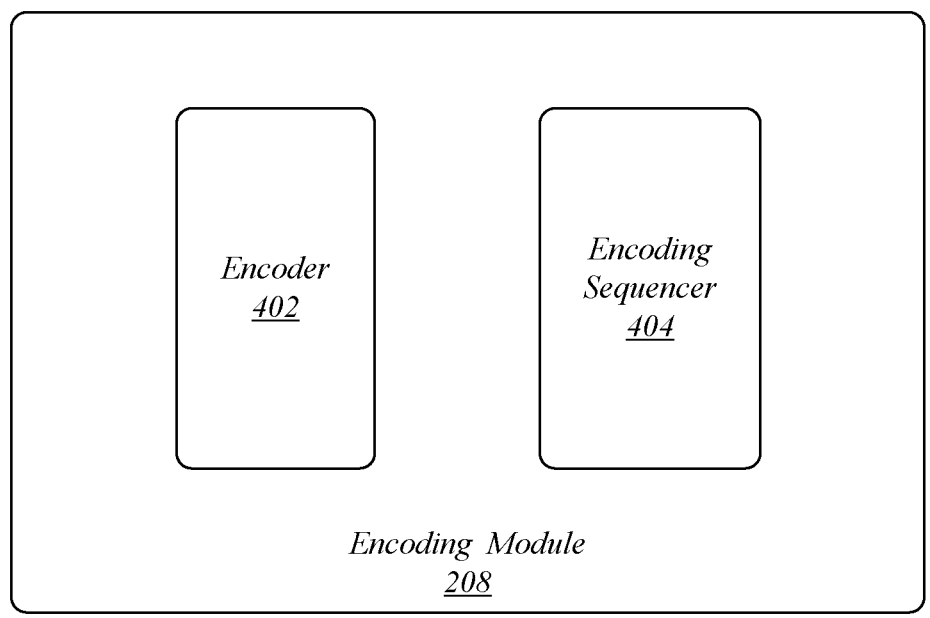
FIG. 4 depicts a block diagram of still another system embodiment.

FIG. 4 depicts an embodiment of an encoding module 208, which may be employed to encode state confidence information retrieved from a memory, as discussed in detail below. Consistent with the present embodiments, the encoding of state confidence information may reduce the amount of bits that would otherwise be processed by a device that retrieves data from a memory, such as memory 106. In particular, the encoding module 208 may facilitate the creation of state confidence data in a concise fashion from multiple sensing measurements that may be applied to a memory cell to more accurately determine the logical state of that cell. The encoding module 208 may include an encoder 402 to output a multiple bit encoded output based upon multiple sense measurements, as detailed below. In addition, the encoding module may include an encoding sequencer to maintain a proper encoding sequence in cases where encoding of multiple-bit memories is to take place.

Figure 5:
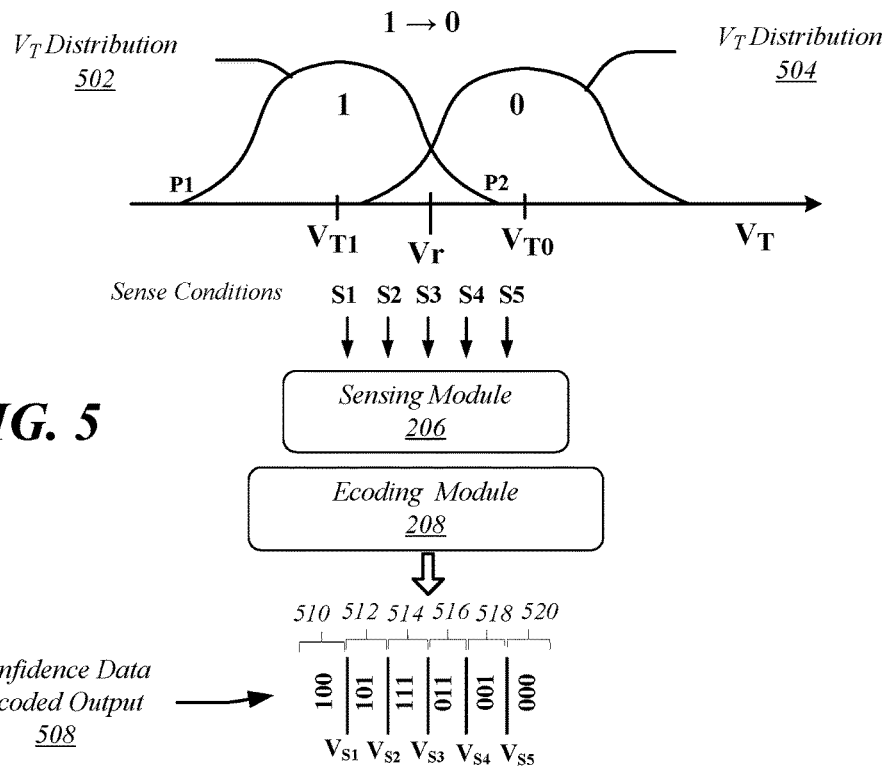
FIG. 5 depicts a scenario consistent with the present embodiments.

FIG. 5 depicts a scenario for reading data consistent with various embodiments. In FIG. 5 there are shown two distributions that represent exemplary distributions of threshold voltage to store two different logical states for memory cells in a NAND memory. These distributions may represent distributions that are designed, empirically determined, or determined by simulation beforehand. The $V_T$ distribution 502 represents a logical state "1" and the $V_T$ distribution 504 represents a logical state "0." In flash NAND technology, the threshold voltage for a transistor in a NAND memory cell may be set to a specific value to indicate the logical state of that memory cell. Accordingly, the logical state of the memory cell may be interrogated by setting a sensing voltage to be higher or lower than the nominal threshold voltage for a given logical state. If the sense voltage applied causes the transistor for the memory cell to turn on or off, it may be determined that the threshold voltage of the transistor has been exceeded and therefore, the logical state of that memory cell was that that corresponds to the given threshold voltage. In a typical sense amp circuit, the determination that a transistor has been turned on is based upon the development of the bit line voltage, which may be sensed at a predetermined time after voltage is applied to the transistor gate of the memory cell being read.

In single bit memory cells, threshold voltage for logical "1" and logical "0" may be set to be sufficiently different voltage ranges so that, in principle, the different logical states may be correctly and accurately read. Thus, referring to FIG. 5, in order to distinguish between the logical "1" and logical "0" a read operation may employ a read sense where the sense voltage is set at the reference voltage $V_r$, which lies between the nominal voltage $V_{T1}$ that characterizes transistors of memory cells in the logical state "1" and $V_{T0}$ that characterizes transistors of memory cells in the logical state "0." If a read sense applied for a given memory cell at the reference voltage $V_r$ causes the transistor to turn on, the logical "1" may be inferred, since the $V_r$ should not be sufficient to turn on a memory cell in logical state "0" whose nominal (or expected) threshold voltage is $V_{T0}$. The nominal threshold voltage may represent a design threshold voltage for a transistor for a given logical state, which may, but need not, be centered within a distribution of actual threshold voltages for different memory cells in an array.

However, as further illustrated in FIG. 5, the $V_T$ distribution 502 and $V_T$ distribution 504 overlap one another along the axis that represents threshold voltage. In other words, in a given memory unit, such as a memory array or set of memory arrays, the exact value of threshold voltage for any given memory cell set to a particular logical state may correspond to any value represented by the respective threshold voltage distribution curve. For example, a memory cell in logical state "1" may have a threshold voltage that spans the range from P1 to P2, as illustrated. Thus, in a memory array characterized by the $V_T$ distribution 502 and $V_T$ distribution 504, some memory cells set for logical state "1" may actually have a greater threshold voltage than other memory cells set for the logical state "0." This situation may arise in current memory cell technology or in coming generations of memory cell technology because of the increased scaling, which may reduce the total range of threshold voltage that can be programmed into memory cells, as well as reduce the ability to control programming of the desired logical state for a given memory cell to the nominal threshold voltage, such as $V_{T1}$ or $V_{T0}$. In particular, overlap of adjacent distributions may be exacerbated when multiple bits are stored in a memory cell, which may entail setting four or more voltage distributions to represent different bits of data, where the voltage distributions may be placed within a similar voltage range as a single bit memory cell. In this manner, the likelihood of voltage distribution overlap may increase because of the closer proximity of each nominal threshold voltage representing a first logical state to its neighbor representing a different logical state.

Consistent with the present embodiments, in order to more accurately determine the memory state (logical state) of a memory cell in a memory array characterized by the $V_T$ distribution 502 and $V_T$ distribution 504, multiple measurements may be performed for a memory read at different sense conditions. A convenient variable to change between different sense operations is the sense reference voltage, (or "sense voltage") since variation of the reference voltage used when sensing the data may be expected to change the probability that the actual threshold voltage of that memory cell has been exceeded. In the example of FIG. 5 are illustrated five measurements at five different sense conditions S1, S2, S3, S4, and S5, which may represent measurements at five different sense reference voltages. As illustrated, the multiple measurements may span a threshold voltage range between the $V_{T1}$ and $V_{T0}$ values, including a range about the reference voltage $V_r$. By virtue of providing measurements for a given memory cell at multiple sense conditions reflecting a range of threshold voltage that spans $V_{T1}$ to $V_{T0}$ multiple types of information regarding the memory cell may be provided. As detailed below, state confidence data that expresses the likelihood of the memory cell being in a particular logical state based upon the results of the multiple measurements may be provided. Additionally, the value of the logical state of the memory cell without state confidence data may be provided.

As shown in FIG. 5, the results of the five measurements may be sent via a sensing module 206 to the encoding module 208 for encoding of information including the value of the logical state of the memory cell, as well as state confidence information. In various embodiments, the encoding module 208 may produce an encoded output in the form of a set of bits, one of which reflects the value of the logical state of the memory cell, and the others of which provide state confidence information. The value of the logical state may be determined by the results of the five measurements under sense conditions S1-S5. For example, for a memory characterized by the $V_T$ distribution 502 and $V_T$ distribution 504, if application of a voltage corresponding to sense condition S1 results in turning on a memory cell, it may be concluded that the memory cell very likely is in a logical state "1." This follows from the fact that the VT distribution 504 has very low probability to extend to voltages as low as that of sense condition S1. Therefore, any memory cell in which the transistor turns on under sense condition S1 most likely corresponds to a memory cell belonging to logical state "1" since the voltage corresponding to sense condition S1 is insufficient except in the rare cases to turn on even a single memory cell that is written to be in logical state "0."

In comparison, if application of a voltage corresponding to sense condition S3, which may be the same as $V_r$ in one example, results in turning on a memory cell, it may also be determined that the memory cell was in a logical state "1." This follows from the fact that most of the $V_T$ distribution 504 does not extend below $V_r$ and therefore, it is unlikely that application of $V_r$ to a memory cell set in logical state "0" would induce the transistor of that memory cell to turn on. However, because a portion of the $V_T$ distribution 504 does extend below $V_r$ the possibility exists that application of the sense condition S3 may turn on a memory cell in logical state "0." Accordingly, the observation that a memory cell transistor turns on in response to sense condition S3 may convey different information than the observation that a memory cell transistor turns on in response to sense condition S1. In particular, the latter observation can be said to denote a logical state "1" with a higher degree of certainty, while in the former case, it is less certain that turning on a transistor in response to sense condition S3 indicates the logical state "1." It may therefore be appreciated that in a typical conventional read operation involving the application of a single sense corresponding to the sense condition S3 at $V_r$, the accuracy of the determination of the logical state "1" may be less than desired for a memory characterized by the $V_T$ distributions 504 and 502. At least for this reason, it may be desirable to provide and encode state confidence information from the results of application of the multiple sense conditions S1-S5, which may include the determined logical state, as well as the likelihood that a given logical state that is read from the memory cell is correct.

In accordance with various embodiments, a multi-bit encoded output may be generated based upon sense operations conducted under the multiple sense conditions S1-S5, where the first bit, a "logical state bit," of the multi-bit encoded output may represent the logical state of a memory cell determined by performing multiple sense operations. One or more additional bits may be set in the multi-bit encoded output to provide state confidence information. In one example, the results of multiple sense operations may be encoded in binary fashion using a single bit twiddle code sequence. As illustrated in FIG. 5, the encoding module 202 may produce the state confidence encoded output 508, which comprises three bits in the example illustrated. In the particular embodiment of FIG. 5, depending on the results of the sense operations S1-S5, the confidence data encoded output 508 may result in one of six three-bit encoded outputs: "1,0,0," "1,0,1", "1,1,1," "0,1,1", "0,0,1," and "0,0, 0." The first bit of each encoded output is set to a "1" when the logical state of the memory cell is a logical "1" and a "0" when the logical state of the memory cell is a logical "0." The following two bits are arranged to convey state confidence information. In the example illustrated, "0,0" may indicate a highest confidence in the value in the first bit, that is, highest confidence that the actual logical state of the read memory cell is that denoted by the first bit. The sequence "1,1" may indicate a lowest confidence in the value of the first bit, and "0,1" may indicate an intermediate confidence level.

Thus, referring back to the aforementioned examples, if a memory cell transistor turns on under the sense condition S1 (corresponding to the voltage $V_{S1}$ shown in the FIG. 5), the three-bit encoded output produced by encoding module 202 is "1,0,0" denoting a logical state "1" with a highest level of confidence. If the memory cell transistor turns on under the sense condition S3 (corresponding to the voltage $V_{S3}$) the three-bit encoded output produced by encoding module 202 is "1,1,1" denoting a logical state "1" with a lowest level of confidence.

As further illustrated in FIG. 5, the encoding module 202 outputs a particular value of the state confidence encoded output 508 when a transistor turns on in response to any voltage in a given range that is applied in a sense operation. FIG. 5 denotes six such ranges 510-520, each corresponding to a different three-bit encoded output. For example, the range 510 denotes a range of sense operation voltages over which the encoding module 202 outputs "1,0,0" if the memory cell transistor turns on in response to the sense operation; the range 512 denotes a range of voltages over which the encoding module 202 outputs "1,0,1" if the memory cell transistor turns on in response to the sense operation, and so forth.

Figure 6A:
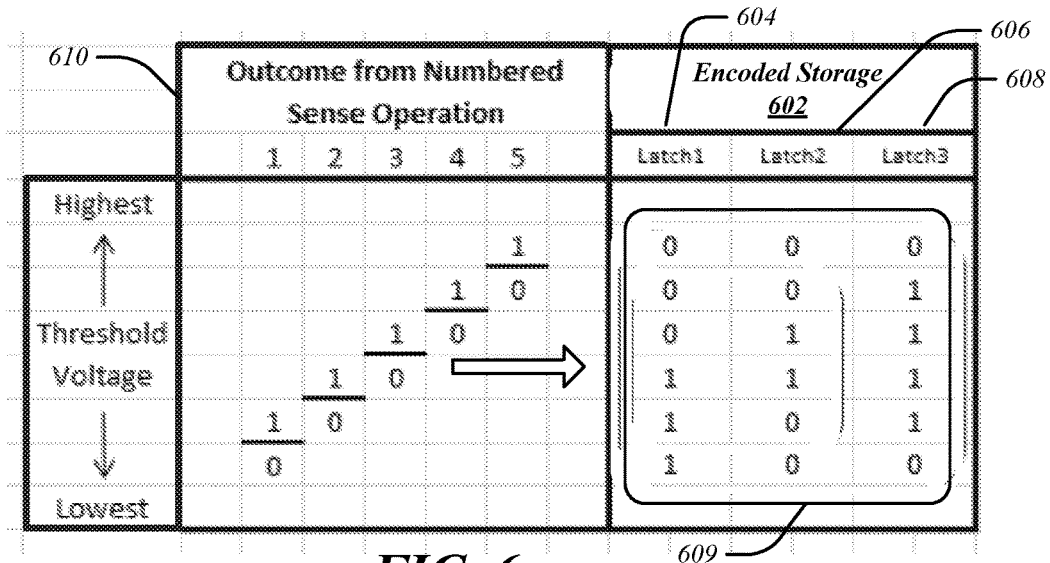
FIG. 6a-6c depict alternative exemplary arrangements.
Figure 6B:
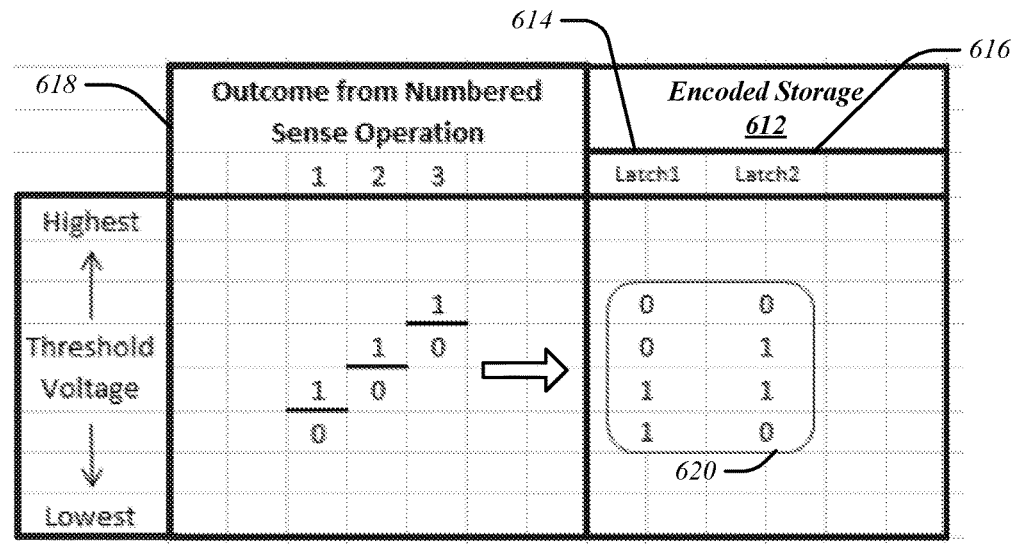
Figure 6C:
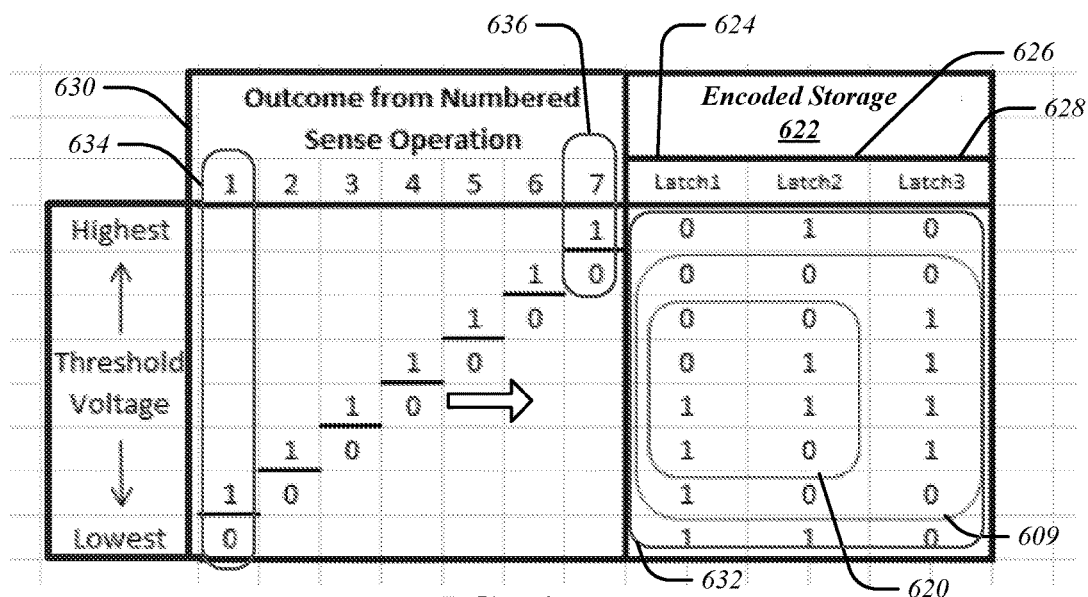

FIGS. 6a-6c present different exemplary arrangements that illustrate state confidence encoding consistent with various embodiments. FIG. 6a illustrates an encoded storage 602, which may be part of the encoder 402 and includes latch1 604, latch2 606, and latch3 608 for storing three-bit encoded state confidence output 609. Following generally the example of FIG. 5, a set of sense operations 610 may be performed under five different sense conditions, corresponding to different threshold voltage levels. As detailed above with respect to FIG. 5, depending upon the threshold voltage of the sense operation at which the transistor turns on, the stored encoded output may vary between extremes of "1,0,0" that denotes a first logical state of the memory cell with a highest degree of certainty to "0,0,0" that denotes a second logical state with a highest degree of certainty, or may have an intermediate value, which asserts one or other logical state with less degree of certainty.

One advantage of the arrangement illustrated by FIGS. 5 and 6a is that the results of five different sense operations may be encoded concisely with only three bits of output, while still providing state confidence information that may be employed as needed to determine the logical state of a memory cell, and thereby the data it represents, to a desired degree of accuracy. For example, in the case where the encoded output is "1,0,1" a requesting device may receive the first bit as "1" and may be satisfied that the logical state of the memory cell in question is "1." Therefore, no further bits of the encoded output may be retrieved. On the other hand, an ECC engine using an LDPC error correction code may require receipt of all three bits of encoded output including state confidence bits in order to properly perform error correction. In the latter case, the ECC engine may determine that the actual logical state of the memory cell in question is less than certain and may process the data accordingly. The illustrated encoding scheme thereby facilitates more robust error correction when needed without having to transmit the results of each of the five sense operations to a requesting device.

FIG. 6b illustrates another encoded storage 612 that includes latch1 614, latch2 616 for encoding of two-bit encoded state confidence output 620. In this embodiment, a set of sense operations 618 may comprise three sense operations performed at three different threshold voltages, as illustrated. The results of the three sense operations may be encoded in four different outputs afforded by the two bits. In this embodiment, the first bit may denote the logical state of the memory cell in question and the second bit may provide the state confidence information. Thus, an output "0" read from the latch2 616 that stores the second bit may indicate higher confidence, while the output "1" read from latch2 616 indicates lower confidence. As with the example of FIG. 6a, the number of bits of data in state confidence encoded output for a given set of sense operations is less than the number of sense operations.

More generally, and consistent with the present embodiments, the number of encoded bits used to encode state confidence output (including the first bit of the output) of multiple sense operations may be sufficient to encode a different output for each sense operation that is conducted at a different threshold voltage. In the example of FIG. 5a, three bits, which can encode eight different values, are employed to encode the result of five different sense operations, which may produce a total of six different outcomes, as shown. Notably, if m different sense voltages are applied in separate operations to a transistor gate, m+1 different outcomes may result, since the transistor may turn on at any one of m different sense voltages, or may fail to turn on even at the highest sense voltage (+1). Thus, a three-bit state confidence output may be used to encode results for up to seven sense operations.

FIG. 6c illustrates one such example in which encoded storage 622 includes latch1 624, latch2 626, and latch3 628 for encoding of three-bit encoded state confidence output 632. In this case a set of sense operations 630 includes seven different sense operations each conducted at a different threshold voltage than the other sense operations. Thus, since m=7, a total of eight different outcomes are possible and may be encoded in the encoded storage 622 as illustrated. In the embodiment illustrated, the two-bit encoded state confidence output 620 and three-bit encoded state confidence output 609 form subsets of the three-bit encoded state confidence output 632. Thus, in addition to the six different outputs of three-bit encoded state confidence output 609, the three-bit encoded state confidence output 632 includes a "1,1,0" entry and a "0,1,0" entry. As illustrated, the "1,1,0" encoded output may be produced when a sense operation 634 is conducted at the lowest threshold voltage results in turning on the transistor of the memory cell. Thus, the first bit "1" indicates a logical state "1" for the measured memory cell, and the bit sequence "1,0" indicates a highest confidence level. Similarly, the "0,1,0" encoded output may be produced when a sense operation 636 is conducted at the highest threshold voltage results in turning on the transistor of the memory cell. Thus, the first bit "0" indicates a logical state "0" for the measured memory cell, and the bit sequence "1,0" indicates a highest confidence level.

One notable feature of the encoding scheme illustrated in the embodiments that produce the encoded state confidence output 609, 620, and 632 is that that only a single bit may need to toggle state between each successive sense operation to change the encoded output from that representing the first sense operation to that representing the next sense operation. This produces the dual advantages of minimizing the energy and time required for the encoding operation.

In addition, in further embodiments, a common encoding scheme may be employed for different types of sense procedures where the number of sense operations is different between the different sense procedures. For example, the results of a sense procedure involving three sense operations, a sense procedure involving five sense operations, and a sense procedure involving seven sense operations may be encoded in a three bit encoding scheme, such as that depicted in FIGS. 5, 6a, and 6c. In some embodiments, an ECC engine may request a change in the number of sense operations used to generate encoded state confidence information without changing the number of bits in the encoded state confidence information. Thus, a seven-sense operation read might be employed to generate a three-bit encoded output that includes state confidence information. Subsequently, a command may be received that results in the switch to a five-sense operation read, which nevertheless is encoded in the same three-bit output format. In this manner, each of the encoded bits in an encoded output being received for error correction may retain the same meaning between different sense procedures involving different numbers of sense operations.

Figure 7:
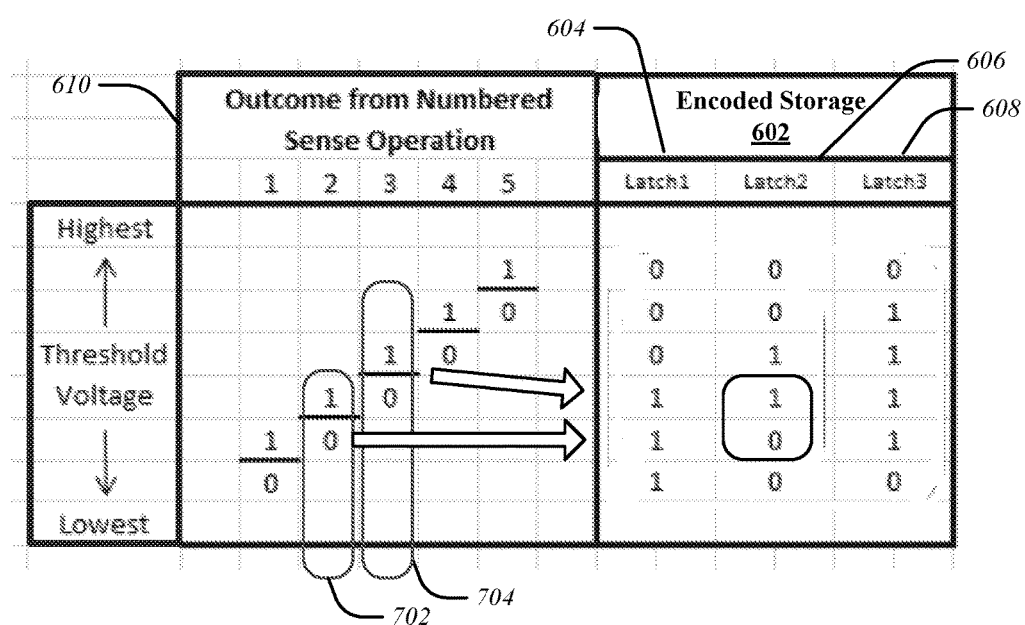

FIG. 7 depicts an exemplary arrangement that demonstrates the single-bit change between successive encoding operations. The encoded state confidence output 609 represents the same encoding scheme as illustrated in FIG. 6a to encode the results of five different sense operations. As illustrated, turning on a transistor as the result of the respective sense operations 702 and 704 yields respective encoded output sequences "1,0,1" and "1,1,1." Thus, in order to change from the first encoded output sequence to the next, only the bit in latch2 606 is changed.

In accordance with various embodiments, a "logical state" bit may be located in any position of a multiple bit encoded output, such as a first, second, or third position of the encoded output.

In various additional embodiments, state confidence data may be encoded from memory arrays that include multiple bit memory cells. For example, a NAND memory cell may store multiple bits. A memory cell capable of storing multiple bits may be referred to as a multi-level cell (MLC). In known MLC technology, a different threshold voltage may be set for each different logical state. Accordingly, a two-bit MLC may be characterized by four ($=2^2$) different threshold voltages, and a three-bit MLC may be characterized by eight ($=2^3$) different threshold voltages. As discussed above, in a memory array having multiple memory cells the threshold voltage associated with a given logical state may be characterized by a distribution of voltages, because the threshold voltage of individual memory cells may deviate from the nominal threshold voltage. The same applies to MLC-based arrays, where each of four, eight, or greater threshold voltages are characterized by a distribution of voltage. In MLC-based arrays, because at least four different threshold voltages must be set (in the case of a two-bit memory cell), an overlap in threshold voltage distributions may also occur, resulting in uncertainty whether the read out bit value of a given MLC bit is correct.

Figure 8A:
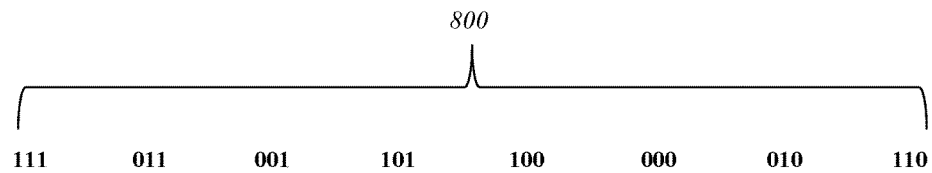
FIGS. 8a-8c depict another scenario consistent with the present embodiments.

Additional embodiments address this problem in a manner similar to the case of single-bit memory cells detailed above. FIG. 8a depicts details of encoding of state confidence information in readout of data from MLC-type memory cells consistent with various embodiments. In the FIG. 8a, an example of data storage in a three-bit MLC is shown in which a data set 800 of one possible arrangement of eight three-bit combinations is illustrated. However, other arrangements are possible. The data set 800 includes eight different sequences of 3-bit logical states that may be stored in a 3-bit MLC memory. In particular, in order from lowest threshold voltage to highest, the different sequences are (1,1,1); (0,1,1); (0,0,1); 1,0,1); (1,0,0); (0,0,0); (0,1,0); (1,1, 0).

Figure 8B:
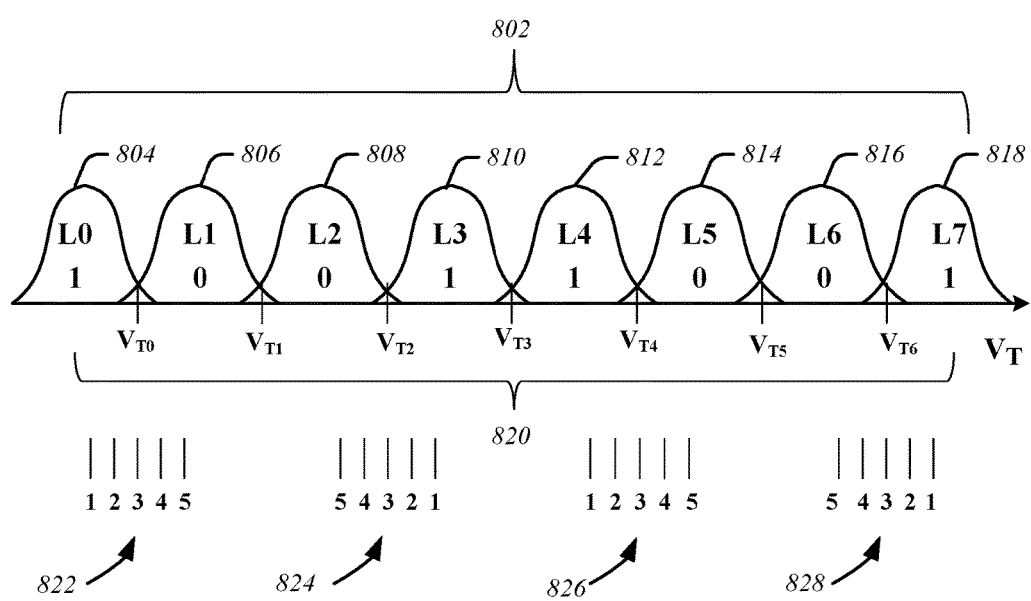

Turning now to FIG. 8b, there is shown a set 802 of threshold voltage distributions that may be used to represent the eight different 3-bit logical state sequences that may be stored in the 3-bit MLC. In particular, the sequences (1,1,1); (0,1,1); (0,0,1); (1,0,1); (1,0,0); (0,0,0); (0,1,0); (1,1,0) may be stored in the respective threshold voltage distributions 804, 806, 808, 810, 812, 814, 816, 818, which correspond to the levels L0, L1, L2, L3, L4, L5, L6, and L7, as shown. In general, in order to determine a logical state of a bit of data in the memory cell represented by the distributions 804-818 of FIG. 8b, sensing may be applied at a sense voltage represented by $V_{T0}$ to $V_{T6}$ as shown. To illustrate this point, each threshold voltage distribution in FIG. 8b also depicts the logical state of the first bit of the three-bit logical state sequence corresponding to that voltage distribution. In order of increasing threshold voltage, the first bits read as "1," "0," "0," "1," "1," "0," "0," "1." This exemplary sequence is useful to minimize the amount of data sense operations required to determine the logical state of the bit being read. For example, if it is desired to read out only the logical state of the first bit without state confidence information, a series of four sense operations may be applied at threshold voltages $V_{T0}$, $V_{T2}$, $V_{T4}$, and $V_{T6}$. These threshold voltages mark the transition between a logical "0" and logical "1" or logical "1" and logical "0" in the first bit, as illustrated in FIG. 8b. Accordingly, when the transistor of the memory cell turns on in response to one of the threshold voltages $V_{T0}$, $V_{T2}$, $V_{T4}$, and $V_{T6}$ the bit state of that cell is known.

In a similar fashion, the bit states of the second and third bits can be probed. For example, in order of increasing threshold voltage, the second bits read as "1," "1," "0," "0," "0," "0," "1," "1." In this case if it is also desired to read out only the logical state of the second bit without state confidence information, a series of only two sense operations need be applied at threshold voltages $V_{T1}$ and $V_{T5}$ because these threshold voltages mark the only transition between a logical "0" and logical "1" or logical "1" and logical "0" for the sequence of second bits. For the third bit, whose pattern reads as "1," "1," "1," "1," "0," "0," "0," "0," only one sense operation need be applied at threshold voltage $V_{T3}$ because this threshold voltage marks the only transition between a logical "0" and logical "1" or logical "1" and logical "0" for the third bit sequence.

In accordance with the present embodiments, FIG. 8b also illustrates an example of how state confidence information may derived from a three-bit MLC by performing a series of sense operations about a set of target threshold voltages that is selected for the appropriate bit of the three-bit MLC to be read. In the particular example shown in FIG. 8b, the state confidence information from the first bit is probed by performing a set of five sense operations about each of the threshold voltages $V_{T0}$, $V_{T2}$, $V_{T4}$, and $V_{T6}$. In this manner, by performing the four sets of sense operations 822, 824, 826, and 828, the logical state of the first bit of the three-bit MLC can be determined together with state confidence data that indicates the reliability of that determination. As further illustrated in FIG. 8b, for example, if the transistor of the three-bit memory cell turns on in response to the sense operation 826-2, it may be determined that the logical state of the first bit is "1" because, according to the threshold voltage distribution 812, most transistors in the memory cell representing 3-bit logical state "1,0,0" would turn on in response to application of the threshold voltage corresponding to the sense operation 826-2, while, according to the threshold voltage distribution 814, most transistors in the memory cell representing 3-bit logical state "0,0,0" would not turn on in response to application of the threshold voltage corresponding to the sense operation 826-2.

Figure 8C:
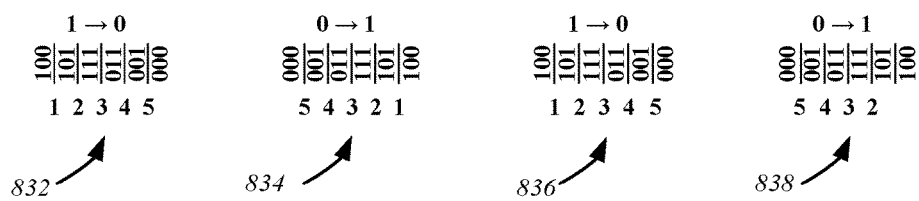

FIG. 8c depicts exemplary sets of state confidence encoded output 832, 834, 836, 834 corresponding to the respective sets of sense operations 822, 824, 826, and 828. Each set of state confidence encoded output contains six different 3-bit sequences to encode output of five different sense operations as described above with respect to FIGS. 5, 6a, and 7. In the example in which the transistor of the three-bit memory cell turns on in response to the sense operation 826-2, the resulting state confidence encoded output is "1,0,1," which denotes that the first bit logical state was "1" and the confidence level that this value is correct is intermediate.

A set of procedures similar to that illustrated in FIGS. 8a-8c may be independently applied to read other bits in the three-bit MLC as desired. However, as noted above, because of the exemplary bit sequence shown in FIG. 8a, to read the second bit, only two sets of sense operations would be necessary, and to read the third bit, only one set of sense operations would be required.

As also shown in FIG. 8c, and in accordance with various embodiments, in order to maintain the meaning of each of the 3-bit codes, the encoding sequence when transitioning from a distribution assigned the logical '0' state to one whose logical value is '1' may be reversed from the sequence when transitioning from a '1' to a '0' distribution. The term "encoding sequence," as used herein, refers to the sequence of successive multi-bit encoded output as a function of different sensing conditions. By reversing the encoding sequence, the highest order (first) bit maintains its meaning as the output data value, which is equivalent to the result of a single sense midway between the two adjacent threshold voltage distributions. As regards the encoded bits in each three-bit encoded output, the meaning is independent of the reversal since the sequence of second and third bits are symmetric about the center state, as illustrated in FIG. 8c. Thus, for example, the encoding sequence of state confidence encoded output 832, delineating the 1>0 transition, is "1,0,0," "1,0,1", "1,1,1," "0,1,1," "0,0,1," and "0,0,0," while the sequence of state confidence encoded output 834, delineating the 0>1 transition, is "0,0,0," "0,0,1," "0,1,1," "1,1,1," "1,0,1", and "1,0,0."

In additional embodiments, encoded state confidence information may be created by performing a set of sense operations in which parameters other than threshold voltage are varied. For example, referring again to FIG. 5, instead of performing a set of five sense operations at different threshold voltages about a reference voltage $V_r$, a set of five sense operations may each be performed at a threshold voltage $V_r$ while the sense time is varied between each sense operation. This approach may have a similar effect as varying threshold voltage applied in the sense operation while the time of the sense operation is held constant. In other words, since measurement of bitline voltage may be used to determine whether a transistor of a memory cell has turned on, the line voltage measured to determine the logical state of a bit is time dependent as well as dependent on the sensing voltage. In further embodiments, other multi-sense operations are possible that involve varying other sensing parameters or combinations of parameters.

In additional embodiments, novel techniques for managing reading of state confidence data from a memory are presented. Since error correction methods that employ an LDPC ECC engine require multiple bits of confidence data, the techniques employed to obtain and parse the data out to an external controller are different than those used for a conventional read operation, as detailed above. As a result, in order for a system be able to properly determine both state confidence data and to read data in a conventional manner, various additional embodiments present techniques for an external controller to indicate to a memory, such as a flash NAND device, that either state confidence data or conventional user data is to be read. Additionally, in some embodiments, in the case where state confidence data is encoded to be output, techniques are provided for the external controller to signal to the NAND device the nature of each succeeding bit that is requested. Thus, for example, when requesting a series of encoded bits, after reading a first encoded bit, signaling may be provided to the NAND device to request a next bit of encoded data from the prior read operation as opposed to requesting new data from a completely different location in memory.

Figure 9:
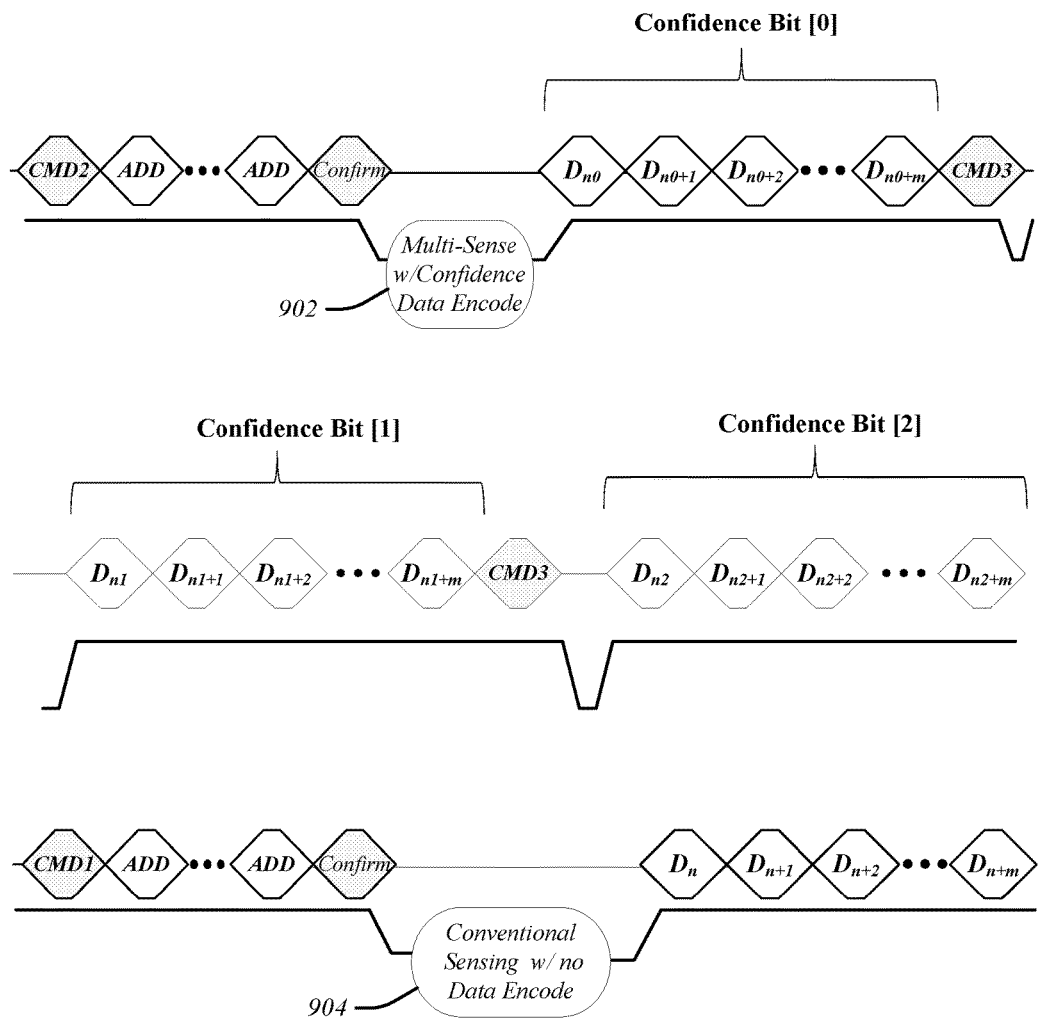
FIG. 9 depicts operation of an exemplary embodiment.

FIG. 9 presents an embodiment that illustrates a set of novel commands that may be provided to a memory to facilitate readout of state confidence data. In one example, a controller, such as an external controller, may employ the data command module 204 to generate the CMD2, which is a novel command that indicates to a memory that the memory is to obtain and encode state confidence data rather than conventional user data. Subsequently, a multiple sense operation 902, such as those disclosed above with respect to FIGS. 5-8c, may be performed, leading to the generation of encoded state confidence information in the form of a multiple bit sequence. When the data including state confidence is ready to be delivered, a data bus (not shown) may first parse out the most significant bit of encoded confidence data, that is, the bit that indicates the logical state of the memory, absent other encoded bits. In an array such as a NAND array, all the data in a page associated with an initial confidence bit [0] may be read out first, which is shown as $D_{n0}, \ldots D_{n0+m}$, where n and m are any positive integer and may be the same integer. When the external controller has received all the desired data associated with confidence bit [0], the command CMD3 may be executed to tell the NAND memory to parse the next bit of confidence data. All the data associated with the next confidence bit [1] may be then read out, which is shown as $D_{n1}, \ldots D_{n1+m}$. When it is has received all the desired data associated with confidence bit [1], the external controller may again executes CMD3 to tell the NAND component to parse the next bit, and so on, until all confidence bits of an encoded output are received.

When conventional data is to be read out, a CMD1 command may be generated as further illustrated in FIG. 9. Subsequently, a conventional sense operation 904 for reading data from the NAND may be performed, which produces the data $D_n, \ldots D_{n+m}$.

In some embodiments, although not explicitly depicted in FIG. 9, a CMD3 command may include additional address information similar to CMD1 and CMD2 that provides to the external controller the capability to randomly select which byte of confidence data to start with when parsing subsequent confidence bits.

In still further embodiments, although not explicitly shown, the above scheme illustrated in FIG. 9 may be extended so that a data read returns to parsing confidence bit [0] by simply wrapping back to bit [0] after delivering all other requested confidence data.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 10:
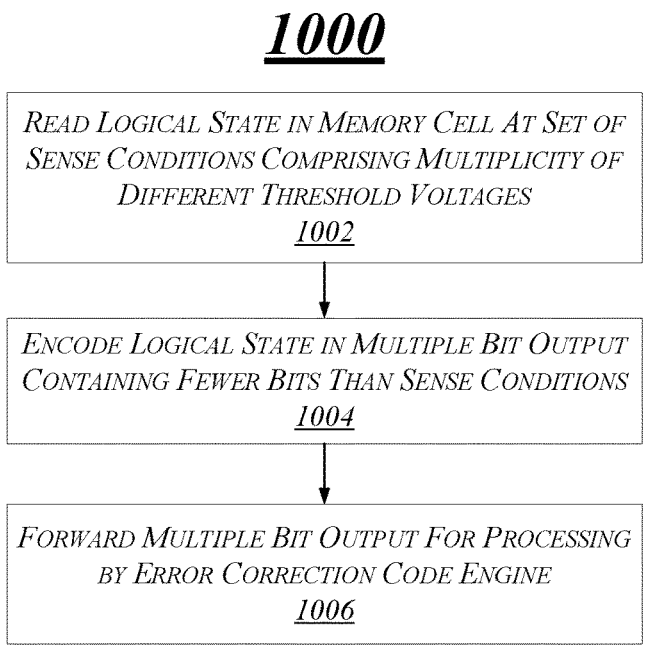
FIG. 10 presents an exemplary first logic flow.

FIG. 10 depicts an exemplary first logic flow 1000. At block 1002, the memory state of a memory cell is read at a set of sense conditions that involve setting multiple different threshold voltages, a different threshold voltage for each sense condition. At block 1004, the memory (logical) state of the memory cell is encoded in a multiple bit output. The multiple bit output encodes the results of the multiple sensing operations using a set of bits that numbers fewer than the total number of sense operations. For example, the results of seven sense operations may be encoded in a set of thee bits. At block 1006, the encoded output is forwarded to an error correction code engine for processing. The error correction code may use LDPC to process state confidence data that is encoded in the multiple bit output.

Figure 11:
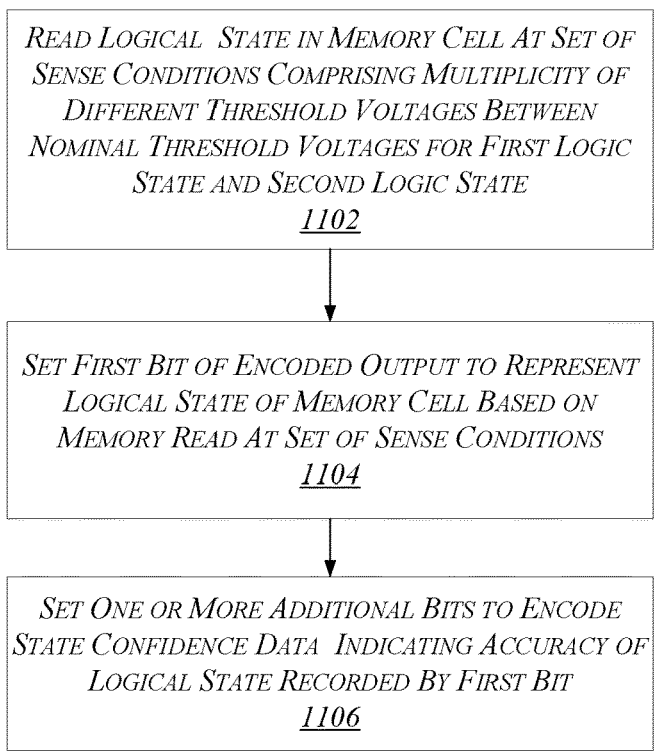
FIG. 11 depicts an exemplary second logic flow.

FIG. 11 depicts an exemplary second logic flow 1100. At block 1102, the logical state of a memory cell is read at a set of sense conditions that involve setting a multiplicity of different threshold voltages than span a range between a nominal threshold voltage for a first logic state and a nominal threshold voltage for a second logic state. The range of different threshold voltages may include a reference voltage that lies halfway between the nominal threshold voltages for the first and second logic states.

At block 1104, a first bit of encoded output is set to represent the logical state of the memory cell based upon the memory read at the set of different sense conditions. At block 1106, one or more additional bits are set in the encoded output to encode state confidence data that indicates the accuracy of the logical state recorded by the first bit of encoded output.

Figure 12:
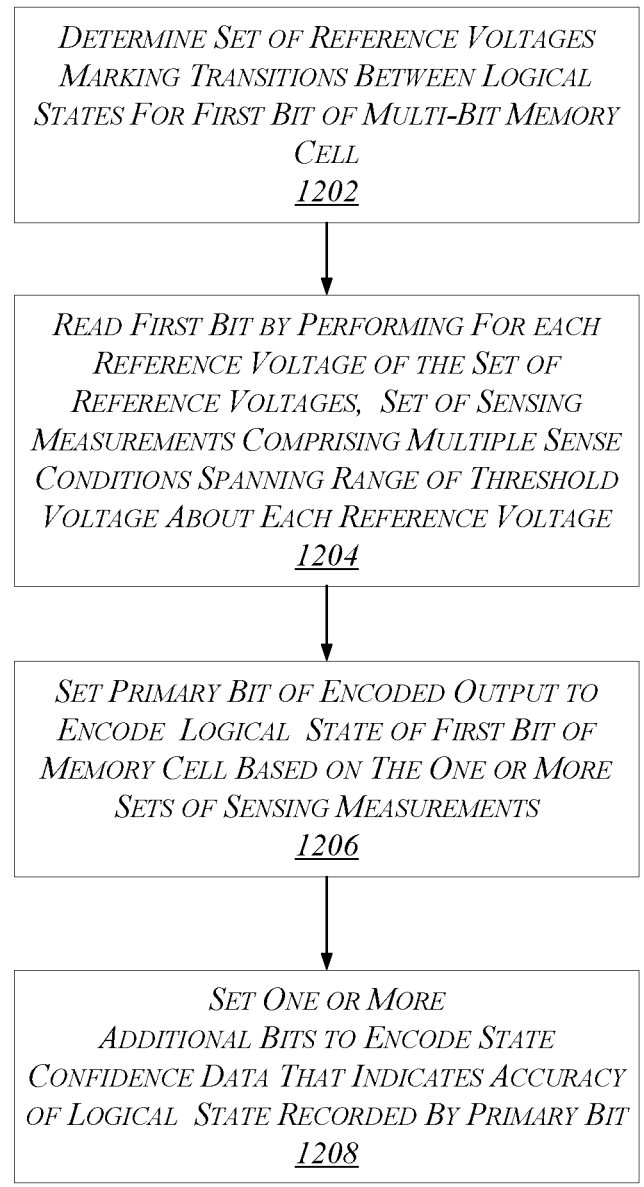
FIG. 12 depicts an exemplary third logic flow.

FIG. 12 depicts an exemplary third logic flow 1200. At block 1202, a set of reference voltages is determined that mark transitions between logical states for a first bit of a multi-bit memory cell (MLC). At block 1204, a first bit is read from the MLC by performing one or more sets of sensing measurements. Each set of sensing measurements comprises multiple sense conditions that span a range of threshold voltage about a reference voltage of the set of reference voltages. The reference voltage may lie midway between a threshold voltage of a first logical state and that of an adjacent logical state. At block 1206, a primary bit of an encoded output is set to encode the logical state of the first bit of the memory cell based upon the one or more sets of sensing measurements. At block 1208, one or more additional bits are set to encode state confidence data that indicates the accuracy of the logical state recorded by the primary bit.

Figure 13:
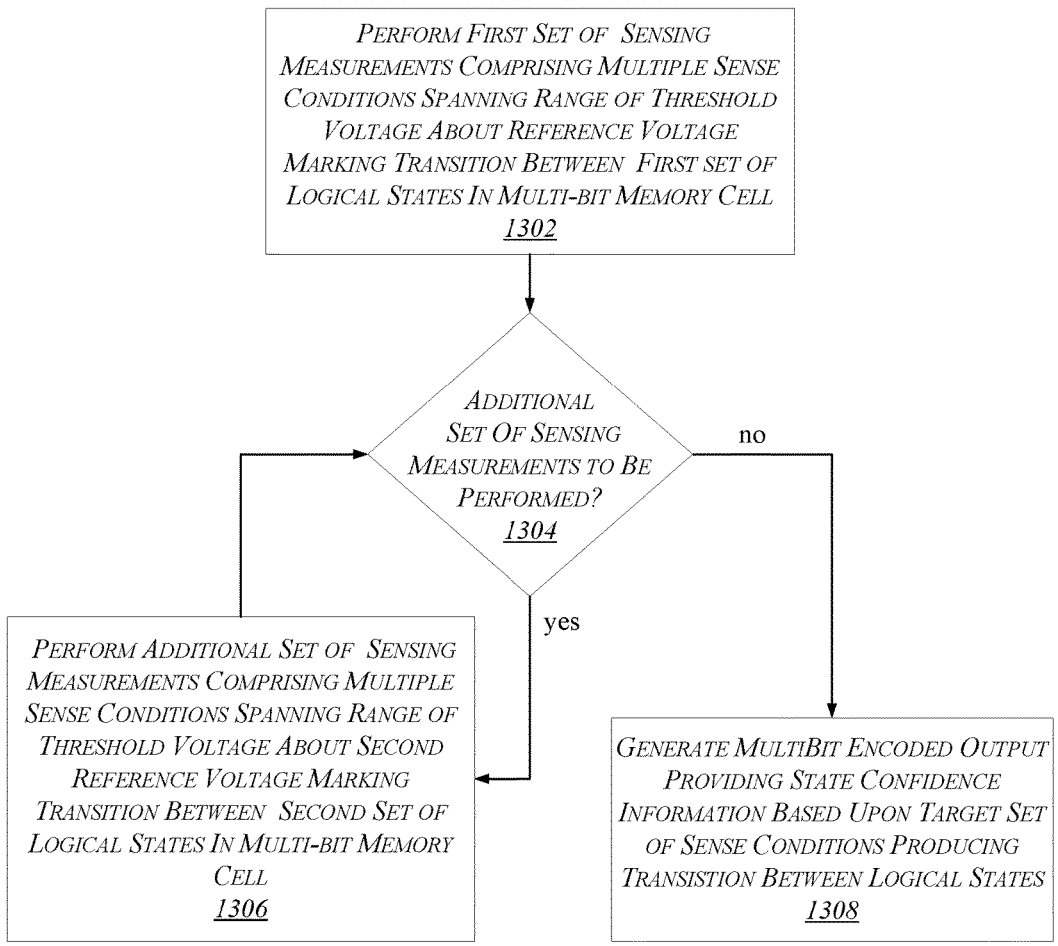
FIG. 13 depicts an exemplary fourth logic flow.

FIG. 13 depicts an exemplary fourth logic flow 1300. At block 1302, a set of sensing measurements are performed that comprise multiple sense conditions spanning a range of threshold voltage about a reference voltage that marks a transition between a first set of logical states in a multi-bit memory cell (MLC). The first set of logical states comprise logical states that are represented by adjacent threshold voltage distributions of a set of threshold voltage distributions that represent the logical states of all combinations of bits that may be stored in the MLC. For example, referring to FIG. 8b, threshold voltage distributions 806 and 808 represent adjacent threshold voltage distributions.

At block 1304 a determination is made as to whether an additional set of sensing measurements is to be performed. For example, in the implementation illustrated in FIGS. 8a-8c, to determine the first bit of the three-bit MLC, four different sets of sensing measurements may be performed, while to determine the third bit, only one set of sensing measurements need be performed. Thus, to perform read of one bit of data associated with a particular memory address in an MLC may require one or more sets of sense operations, depending on the position of the bit to be read and the storage scheme for storing the bits. If more measurements are to be performed, the flow moves to block 1306.

At block 1306, an additional set of sensing measurements is performed that comprises multiple different sensing conditions spanning a range of threshold voltage about a second reference voltage marking the transition between a second set of logical states in the MLC. The flow then returns to block 1304.

If, at block 1304, no additional set of sensing measurements is to be performed, the flow moves to block 1308. At block 1308, a multi-bit encoded output is generated that provides state confidence information based upon a target set of sense conditions that produced a transition between logical states.

Figure 14:
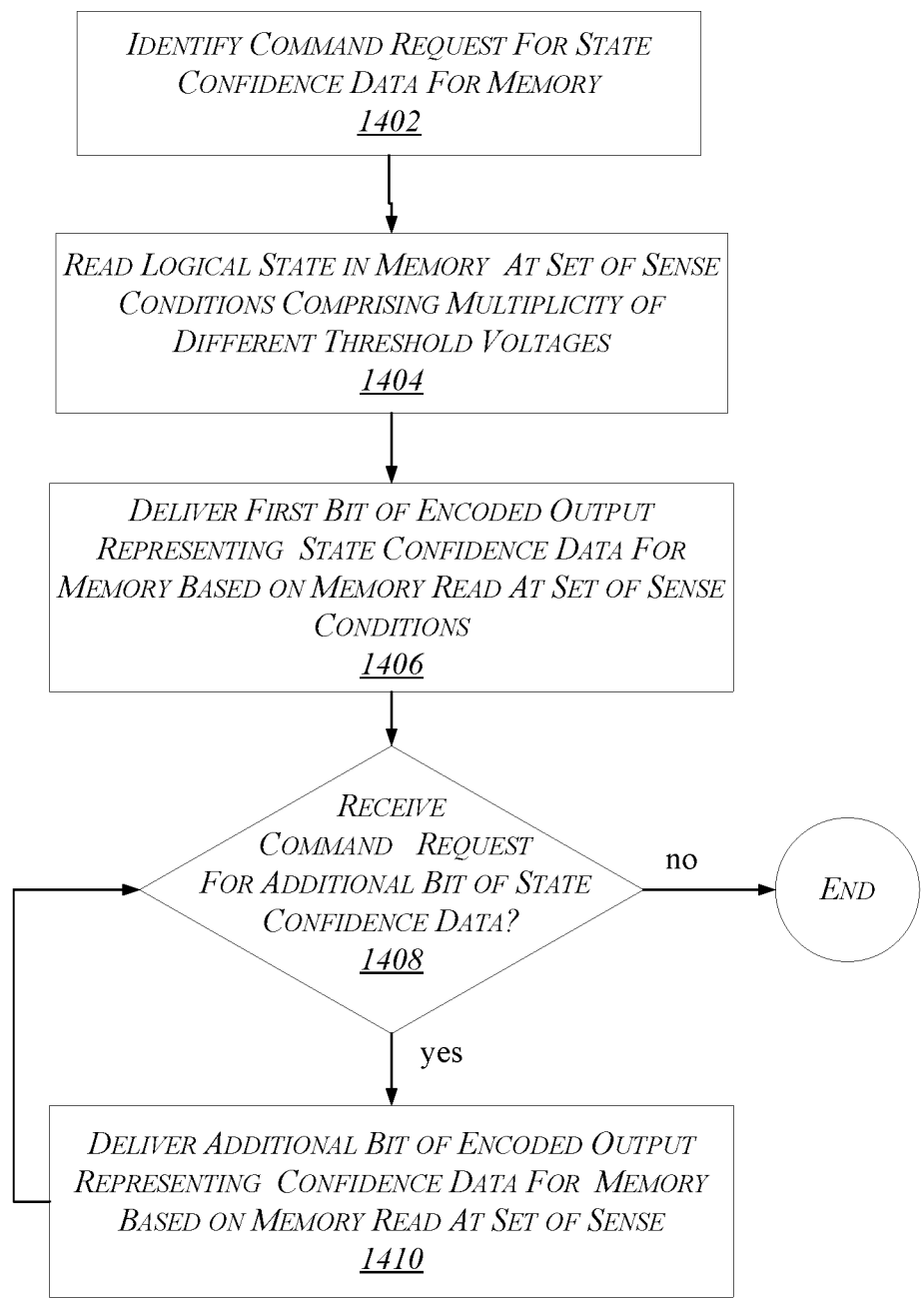
FIG. 14 depicts an exemplary fifth logic flow.

FIG. 14 depicts an exemplary fifth logic flow 1400. At block 1402 a command request is identified that requests state confidence data from a memory. At block 1404, the logical state of the memory is read at a set of sense conditions that comprise multiple different threshold voltages. At block 1406, a first bit of encoded output is delivered that represents state confidence data for the memory based on the memory read at the set of sense conditions. At block 1408, if a command request is received for an additional bit of state confidence data, the flow moves to block 1410. At block 1410, an additional bit of encoded output is delivered that represents confidence data for the memory based on the memory read at the set of sense conditions. This logic flow may continue until no request for an additional bit of confidence data is received, at which point the logic flow ends.

Figure 15:
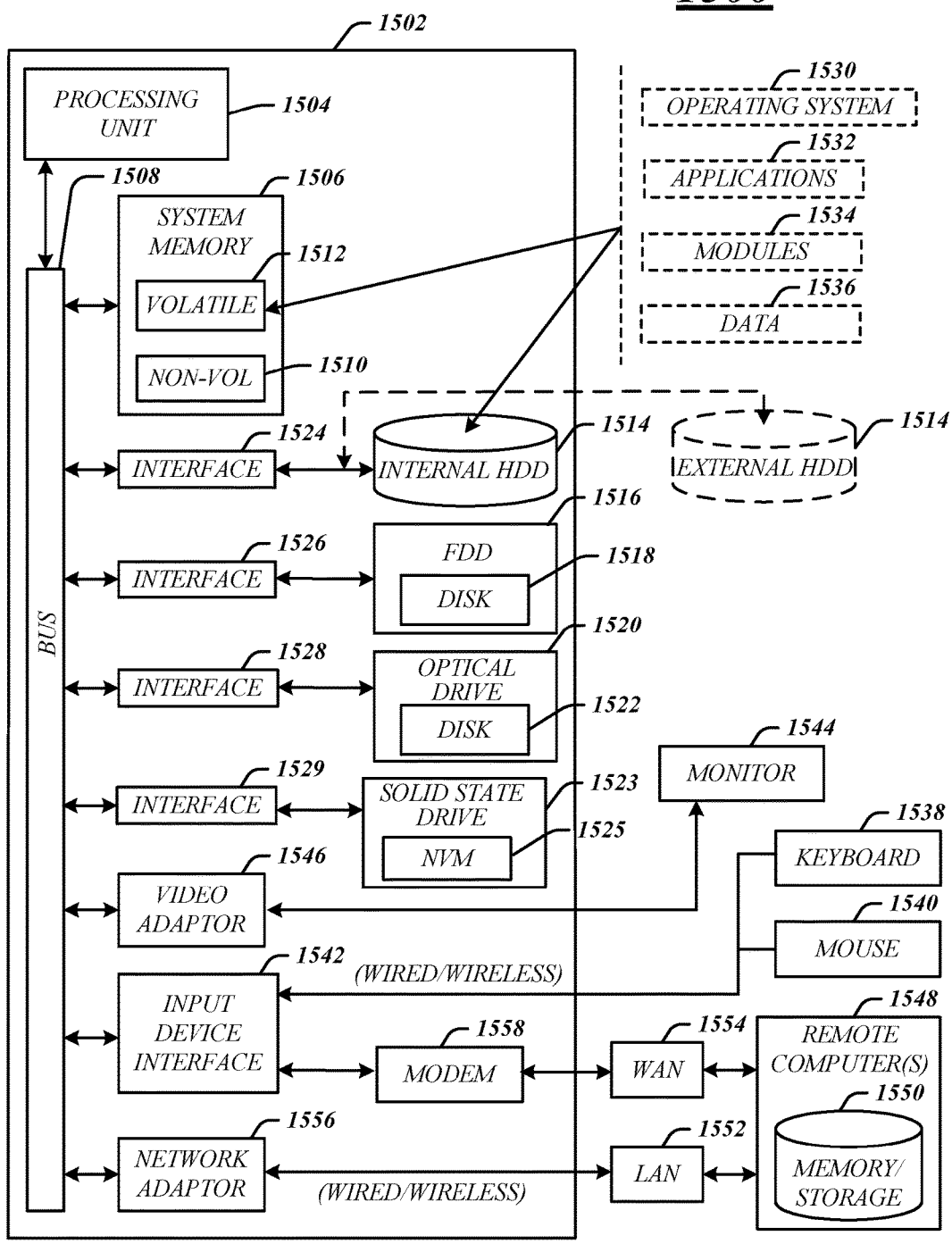
FIG. 15 is a diagram of an exemplary system embodiment.

FIG. 15 illustrates an embodiment of an exemplary computing architecture 1500 suitable for implementing various embodiments as previously described. As used in this application, the terms "system" and "component" are intended to refer to a computer-related entity, either hardware, a combination of hardware and software, software, or software in execution, examples of which are provided by the exemplary computing architecture 1500. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

In one embodiment, the computing architecture 1500 may comprise or be implemented as part of an electronic device. Examples of an electronic device may include without limitation a mobile device, a personal digital assistant, a mobile computing device, a smart phone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combination thereof. The embodiments are not limited in this context.

The computing architecture 1500 includes various common computing elements, such as one or more processors, co-processors, memory units, chipsets, controllers, peripherals, interfaces, oscillators, timing devices, video cards, audio cards, multimedia input/output (I/O) components, and so forth. The embodiments, however, are not limited to implementation by the computing architecture 1500.

As shown in FIG. 15, the computing architecture 1500 comprises a processing unit 1504, a system memory 1506 and a system bus 1508. The processing unit 1504 can be any of various commercially available processors. Dual microprocessors and other multi-processor architectures may also be employed as the processing unit 1504. The system bus 1508 provides an interface for system components including, but not limited to, the system memory 1506 to the processing unit 1504. The system bus 1508 can be any of several types of bus structure that may further interconnect to a memory bus (with or without a memory controller), a peripheral bus, and a local bus using any of a variety of commercially available bus architectures.

The computing architecture 1500 may comprise or implement various articles of manufacture. An article of manufacture may comprise a computer-readable storage medium to store logic. Embodiments may also be at least partly implemented as instructions contained in or on a non-transitory computer-readable medium, which may be read and executed by one or more processors to enable performance of the operations described herein. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like.

The system memory 1506 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. In the illustrated embodiment shown in FIG. 15, the system memory 1506 can include non-volatile memory 1510 and/or volatile memory 1512. A basic input/output system (BIOS) can be stored in the non-volatile memory 1510.

The computer 1502 may include various types of computer-readable storage media in the form of one or more lower speed memory units, including an internal hard disk drive (HDD) 1514, a magnetic floppy disk drive (FDD) 1516 to read from or write to a removable magnetic disk 1518, and an optical disk drive 1520 to read from or write to a removable optical disk 1522 (e.g., a CD-ROM or DVD); and a solid state drive (SSD) 1523 to read or write data to/from a non-volatile memory (NVM) 1525, including a NAND flash memory, phase change memory (PCM), a spin memory; phase change memory with switch (PCMS), magnetoresistive random access memory (MRAM), spin memory, nanowire memory, ferroelectric transistor random access memory (FeTRAM). The HDD 1514, FDD 1516, optical disk drive 1520, and solid state drive 1523 can be connected to the system bus 1508 by a HDD interface 1524, an FDD interface 1526, an optical drive interface 1528, and a solid state drive interface 1529, respectively. The HDD interface 1524 for external drive implementations can include at least one or both of Universal Serial Bus (USB) and IEEE 1394 interface technologies. The solid state drive interface 1529 may comprise any suitable interface for coupling to the host device, such as, for example, but not limited to, a serial advanced technology attachment (SATA) interface, a serial attached SCSI (SAS) interface, a universal serial bus (USB) interface, a peripheral control interface (PCI), or other suitable device interface.

The drives and associated computer-readable media provide volatile and/or nonvolatile storage of data, data structures, computer-executable instructions, and so forth. For example, a number of program modules can be stored in the drives and memory units 1510, 1512, including an operating system 1530, one or more application programs 1532, other program modules 1534, and program data 1536.

A user can enter commands and information into the computer 1502 through one or more wire/wireless input devices, for example, a keyboard 1538 and a pointing device, such as a mouse 1540. Other input devices may include a microphone, an infra-red (IR) remote control, a joystick, a game pad, a stylus pen, touch screen, or the like. These and other input devices are often connected to the processing unit 1504 through an input device interface 1542 that is coupled to the system bus 1508, but can be connected by other interfaces such as a parallel port, IEEE 1394 serial port, a game port, a USB port, an IR interface, and so forth.

A monitor 1544 or other type of display device is also connected to the system bus 1508 via an interface, such as a video adaptor 1546. In addition to the monitor 1544, a computer typically includes other peripheral output devices, such as speakers, printers, and so forth.

The computer 1502 may operate in a networked environment using logical connections via wire and/or wireless communications to one or more remote computers, such as a remote computer 1548. The remote computer 1548 can be a workstation, a server computer, a router, a personal computer, portable computer, microprocessor-based entertainment appliance, a peer device or other common network node, and typically includes many or all of the elements described relative to the computer 1502, although, for purposes of brevity, only a memory/storage device 1550 is illustrated. The logical connections depicted include wire/wireless connectivity to a local area network (LAN) 1552 and/or larger networks, for example, a wide area network (WAN) 1554. Such LAN and WAN networking environments are commonplace in offices and companies, and facilitate enterprise-wide computer networks, such as intranets, all of which may connect to a global communications network, for example, the Internet.

When used in a LAN networking environment, the computer 1502 is connected to the LAN 1552 through a wire and/or wireless communication network interface or adaptor 1556. The adaptor 1556 can facilitate wire and/or wireless communications to the LAN 1552, which may also include a wireless access point disposed thereon for communicating with the wireless functionality of the adaptor 856.

When used in a WAN networking environment, the computer 1502 can include a modem 1558, or is connected to a communications server on the WAN 1554, or has other means for establishing communications over the WAN 1554, such as by way of the Internet. The modem 1558, which can be internal or external and a wire and/or wireless device, connects to the system bus 1508 via the input device interface 1542. In a networked environment, program modules depicted relative to the computer 1502, or portions thereof, can be stored in the remote memory/storage device 1550. It will be appreciated that the network connections shown are exemplary and other means of establishing a communications link between the computers can be used.

The computer 1502 is operable to communicate with wire and wireless devices or entities using the IEEE 802 family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity), WiMax, and Bluetooth™ wireless technologies. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

In one embodiment, an apparatus may include a controller to retrieve data from a non-volatile memory, and an error correction module operable on the controller to read a memory cell of the non-volatile memory at a first set of sense conditions comprising a multiplicity of sense conditions. The error correction module may be further operable on the controller to set a first set of bits in an encoded output, the first set of bits comprising a logical state bit to indicate a logical state of the memory cell and one or more additional bits in the encoded output to indicate accuracy of the logical state bit based upon results of the read at the first set of sense conditions, the first set of sense conditions comprising a greater number than that of the first set of bits.

In another embodiment, the non-volatile memory may comprise a NAND memory, and the error correction module operable on the controller to apply a low density parity check (LDPC) correction to determine bit errors in the non-volatile memory.

Alternatively, or in addition, in a further embodiment the first set of bits may correspond to a result of application of multiple sense conditions that include the application of at least one sense reference voltage that lies between a first threshold voltage representing a nominal threshold voltage for a first logical state of the non-volatile memory cell and a second threshold voltage representing a nominal threshold voltage for a second logical state of the memory cell.

Alternatively, or in addition, in a further embodiment, the first set of sense conditions may comprise a first set of sense reference voltages that span a range of threshold voltage between that of the first and second threshold voltages.

Alternatively, or in addition the error correction module may be operable on the controller to set an n-bit encoded state confidence output based upon results of application of one or more sets of sense conditions, one or more sets of sense conditions comprising a set of sense conditions equal to less than $2.^n$ Alternatively, or in addition, in a further embodiment, the error correction module may be operable on the controller to perform a memory read upon a multiple-bit memory cell, wherein the memory read comprises determining, for a first bit of the multiple-bit memory cell, a set of reference voltages marking a respective set of transitions between logical states. The memory read may also comprise performing, for each reference voltage of the set of reference voltages, a set of sensing measurements, each set of sensing measurements comprising reading the non-volatile memory at multiple sense reference voltages that span a range of threshold voltage about the each reference voltage.

Alternatively, or in addition, in a further embodiment the error correction module may be operable on the controller to generate a first encoding sequence of the encoded output when an increase in threshold voltage corresponds to a transition between logical "0" and logical "1," and to generate a second encoding sequence that is a reverse of the first encoding sequence when an increase in threshold voltage corresponds to a transition between logical "1" and logical "0."

Alternatively, or in addition, in a further embodiment, the apparatus may comprise a data command module operable on the controller to transmit the encoded output from the non-volatile memory to a system controller, generate a first command that indicates a request to the non-volatile memory for conventional user data, and to generate a second command that indicates a request for state confidence data.

Alternatively, or in addition, in a further embodiment the data command module may be operable on the controller to provide a third command to the non-volatile memory when requesting a next bit of encoded data derived from a prior read sense operation.

Alternatively, or in addition, in a further embodiment the apparatus may include a digital display to present results of data read from the non-volatile memory.

In another embodiment, a computer implemented method may include reading a memory cell of a non-volatile memory at a first set of sense conditions comprising a multiplicity of sense conditions. The computer implemented method may further include allocating a first set of bits whose number is less than that of the sense conditions to encode results of the reading the memory cell as an encoded output, and setting a first set of bits in an encoded output, the first set of bits comprising a logical state bit to indicate a logical state of the memory cell and one or more additional bits in the encoded output to indicate accuracy of the logical state bit based upon results of the read at the first set of sense conditions, the first set of sense conditions comprising a greater number than that of the first set of bits.

In an additional embodiment, the method may include applying a low density parity check (LDPC) correction to determine bit errors in the non-volatile memory.

Alternatively, or in addition, in a further embodiment the setting the first set of bits may include determining results of sensing the non-volatile memory at a first set of sense conditions that span a range of threshold voltage between a lower threshold voltage representing a nominal threshold voltage for a first logical state of the memory cell and a higher threshold voltage representing a nominal threshold voltage for a second logical state of the memory cell.

Alternatively, or in addition, in a further embodiment the method may include setting a three-bit encoded output based upon results of application of each of different sets of sense conditions, the different sets of sense conditions comprising a set of three sense reference voltages, a set of five sense reference voltages, and a set of seven reference voltages.

Alternatively, or in addition, in a further embodiment, the method may include determining a set of reference voltages marking transitions between logical states for a first bit of the multiple-bit memory cell, and performing a set of sensing measurements, each set of sensing measurements comprising reading the non-volatile memory at multiple sense reference voltages that span a range of threshold voltage about the each reference voltage of the set of reference voltages.

Alternatively, or in addition, in a further embodiment the method may include generating a first encoding sequence of the encoded output when an increase in threshold voltage corresponds to a transition between logical "0" and logical "1," and generating a second encoding sequence that is a reverse of the first encoding sequence when an increase in threshold voltage corresponds to a transition between logical "1" and logical "0."

Alternatively, or in addition, in a further embodiment the method may include generating a first command that indicates a request to the non-volatile memory for conventional user data, and generating a second command that indicates a request for state confidence data.

Alternatively, or in addition, in a further embodiment the method may include providing a third command to the non-volatile memory when requesting a next bit of encoded data derived from a prior read sense operation.

In a further embodiment, an apparatus may include means for performing the method of any one of the preceding embodiments.

In another embodiment, at least one machine readable medium may include a plurality of instructions that in response to being executed on a computing device, cause the computing device to carry out a method according to any one of the preceding embodiments.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a computer-readable medium or article which may store an instruction or a set of instructions that, if executed by a computer, may cause the computer to perform a method and/or operations in accordance with the embodiments. Such a computer may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a controller to retrieve data from a non-volatile memory;
an error correction module operable on the controller to:
read a memory cell of the memory at a first set of sense conditions comprising a multiplicity of sense conditions; and
set a first set of bits in an encoded output, the first set of bits comprising a logical state bit to indicate a logical state of the memory cell and one or more additional bits to indicate accuracy of the logical state bit based upon results of the read at the first set of sense conditions, the first set of sense conditions comprising a greater number of sense conditions than a number of bits comprised in the first set of bits; and
a data command module operable on the controller to:
transmit the encoded output from the non-volatile memory to a system controller;
generate a first command that indicates a request to the non-volatile memory for conventional user data; and
generate a second command that indicates a request for state confidence data.

2. The apparatus of claim 1, the non-volatile memory comprising a NAND memory, and the error correction module operable on the controller to apply a low density parity check (LDPC) correction to determine bit errors in the non-volatile memory.

3. The apparatus of claim 1, the first set of bits corresponding to a result of application of multiple sense conditions that include the application of at least one sense reference voltage that lies between a first threshold voltage representing a nominal threshold voltage for a first logical state of the memory cell and a second threshold voltage representing a nominal threshold voltage for a second logical state of the memory cell.

4. The apparatus of claim 3, the first set of sense conditions comprising a first set of sense reference voltages that span a range of threshold voltage between the first threshold voltage and the second threshold voltage.

5. The apparatus of claim 1, the error correction module operable on the controller to:
set an n-bit encoded state confidence output based upon results of application of one or more sets of sense conditions, one or more sets of sense conditions comprising a set of sense conditions equal to less than $2^n$.

6. The apparatus of claim 1, the error correction module operable on the controller to perform a memory read upon a multiple-bit memory cell, the memory read comprising:
determining, for a first bit of the multiple-bit memory cell, a set of reference voltages marking a respective set of transitions between logical states; and
performing, for each reference voltage of the set of reference voltages, a set of sensing measurements, the set of sensing measurements comprising reading the non-volatile memory at multiple sense reference voltages that span a range of threshold voltage about the each reference voltage.

7. The apparatus of claim 6, the error correction module operable on the controller to:
generate a first encoding sequence of the encoded output when a threshold voltage increase corresponds to a transition between logical "0" and logical "1;" and
generate a second encoding sequence that is a reverse of the first encoding sequence when the threshold voltage increase corresponds to a transition between logical "1" and logical "0".

8. The apparatus of claim 1, the data command module operable on the controller to provide a third command to the non-volatile memory when requesting a next bit of encoded data derived from a prior read sense operation.

9. A computer implemented method, comprising:
reading a memory cell of a non-volatile memory at a first set of sense conditions comprising a multiplicity of sense conditions;
allocating a first set of bits whose number is less than that of the sense conditions to encode results of the reading the memory cell as an encoded output;
setting a first set of bits in an encoded output, the first set of bits comprising a logical state bit to indicate a logical state of the memory cell and one or more additional bits in the encoded output to indicate accuracy of the logical state bit based upon results of the read at the first set of sense conditions, the first set of sense conditions comprising a greater number of sense conditions than a number of bits comprised in the first set of bits;

generating a first command that indicates a request to the non-volatile memory for conventional user data; and generating a second command that indicates a request for state confidence data.

10. The computer implemented method of claim 9, comprising applying a low density parity check (LDPC) correction to determine bit errors in the non-volatile memory.

11. The computer implemented method of claim 9, the setting the first set of bits comprising determining results of sensing the non-volatile memory at a set of sense conditions that span a range of threshold voltage between a lower threshold voltage representing a nominal threshold voltage for a first logical state of the memory cell and a higher threshold voltage representing a nominal threshold voltage for a second logical state of the memory cell.

12. The computer implemented method of claim 9, comprising:

setting a three-bit encoded state confidence output based upon results of application of each of multiple different sets of sense conditions, the multiple different sets of sense conditions comprising a set of three sense reference voltages, a set of five sense reference voltages, and a set of seven reference voltages.

13. The computer implemented method of claim 9, comprising:

determining a set of reference voltages marking transitions between logical states for a first bit of a multiple-bit memory cell; and performing a set of sensing measurements, the set of sensing measurements comprising reading the non-volatile memory at multiple sense reference voltages that span a range of threshold voltage about each reference voltage of the set of reference voltages.

14. The computer implemented method of claim 9, comprising:

generating a first encoding sequence of the encoded output when a threshold voltage increase corresponds to a transition between logical "0" and logical "1;" and generating a second encoding sequence that is a reverse of the first encoding sequence when the threshold voltage increase corresponds to a transition between logical "1" and logical "0".

15. The computer implemented method of claim 9, comprising providing a third command to the non-volatile memory when requesting a next bit of encoded data derived from a prior read sense operation.

16. An apparatus comprising means for performing the method of claim 9.

17. At least one non-transitory machine readable medium comprising a plurality of instructions that in response to being executed on a computing device, cause the computing device to carry out a method according to claim 9.

* * * * *